US008228068B2

(12) United States Patent
Archer et al.

(10) Patent No.: US 8,228,068 B2
(45) Date of Patent: Jul. 24, 2012

(54) SYSTEMS AND METHODS FOR DETECTING WIRE BREAKS

(75) Inventors: James F. Archer, Gray, TN (US); Robert Alan Weddle, Watauga, TN (US)

(73) Assignee: Siemens Aktiengesellschaft, Munich (DE)

( * ) Notice: Subject to any disclaimer, the term of this patent is extended or adjusted under 35 U.S.C. 154(b) by 477 days.

(21) Appl. No.: 12/422,440

(22) Filed: Apr. 13, 2009

(65) Prior Publication Data

US 2009/0273350 A1     Nov. 5, 2009

Related U.S. Application Data

(60) Provisional application No. 61/049,828, filed on May 2, 2008.

(51) Int. Cl.
*G01R 31/00* (2006.01)

(52) U.S. Cl. .................. 324/508; 324/522; 324/525

(58) Field of Classification Search .............. 324/508
See application file for complete search history.

(56) References Cited

U.S. PATENT DOCUMENTS

| 3,590,370 | A | * | 6/1971 | Fleischer | 324/537 |
| 3,829,849 | A | * | 8/1974 | Stauffer | 340/635 |
| 4,155,080 | A | * | 5/1979 | Kovacs | 340/595 |
| 4,721,957 | A | * | 1/1988 | Buttle | 340/870.39 |
| 5,150,057 | A | * | 9/1992 | Suptitz et al. | 324/508 |
| 5,224,006 | A | * | 6/1993 | MacKenzie et al. | 361/45 |
| 5,532,601 | A | * | 7/1996 | Weir et al. | 324/539 |
| 6,313,639 | B1 | * | 11/2001 | Griepentrog | 324/500 |
| 6,437,576 | B2 | * | 8/2002 | Lorito | 324/509 |
| 6,825,673 | B1 | * | 11/2004 | Yamaoka | 324/537 |
| 6,992,490 | B2 | * | 1/2006 | Nomoto et al. | 324/522 |
| 2007/0176604 | A1 | * | 8/2007 | Morimoto | 324/525 |
| 2008/0084323 | A1 | * | 4/2008 | Stad et al. | 340/652 |

FOREIGN PATENT DOCUMENTS

| CN | 2426143 Y | 4/2001 |
| JP | 63277981 A | 11/1988 |
| JP | 2005156389 A | 6/2005 |

* cited by examiner

*Primary Examiner* — Richard Isla Rodas

(57) ABSTRACT

A circuit is provided that includes a power source and a sensor circuit electrically coupled by a switch to the power source. The circuit further includes an A/D converter electrically coupled to the sensor circuit and adapted to read a voltage difference across a resistive element to determine an impedance of the sensor circuit. A method is provided that includes closing a switch electrically coupling a power source to a sensor circuit and measuring a voltage difference across a resistive element at an A/D converter electrically coupled to the sensor circuit. The method further includes determining an impedance of the sensor circuit based on the voltage difference.

22 Claims, 3 Drawing Sheets

SYSTEMS AND METHODS FOR DETECTING WIRE BREAKS

This application claims the benefit of U.S. Provisional Application No. 61/049,828, filed May 2, 2008, the disclosure of which is herein incorporated by reference.

FIELD OF THE INVENTION

The present invention relates to detecting wire breaks. In particular, a method and system are provided for detecting wire breaks in sensor circuits.

BACKGROUND OF THE INVENTION

Industrial processes may be controlled in part by electronic systems using sensors. Some factory automated processes may be critical and/or time-sensitive. Faulty sensor values must not be reported to the central controller to prevent upsetting these processes.

With process control systems, it is critical that all process data that is reported back to the central controller be valid. During a wire break event using conventional wire break detection systems, it is possible to send intermediate process data values since the wire break event is asynchronous to the internal circuitry for the module. A wire break event asynchronous to the timing of the internal circuit can cause intermediate data results, which do not trigger a wire break event in a conventional wire break detection circuit, to be logged even though they do not represent valid sensor data.

Methods used to determine sensor wire integrity may typically induce a stimulus that will force a value of the sensor input to an invalid state if the sensor wiring is not intact. In this case, it is not always possible to differentiate between an over/under voltage condition and a wire-break event. These conditions are not acceptable in some process control systems.

SUMMARY OF THE INVENTION

A method is provided to ensure that the wiring to a sensor is intact for each process value before data is reported to a central controller.

A circuit is provided that includes a power source and a sensor circuit electrically coupled by a switch to the power source. The circuit further includes an A/D converter electrically coupled to the sensor circuit and adapted to read a voltage difference across a resistive element to determine an impedance of the sensor circuit.

In the circuit, the sensor circuit may be adapted to output a measurement voltage when the switch is open, and the A/D converter may be adapted to read a measurement voltage proportional to a physical quantity.

The circuit may further include a controller adapted to compare the impedance of the sensor circuit to an acceptance range. The acceptance range indicates that a wire break condition does not exist. The controller is further adapted to log the measurement voltage if the impedance falls within the acceptance range. The controller may be further adapted to output an error signal if the impedance falls outside the acceptance range.

A method is provided that includes closing a switch electrically coupling a power source to a sensor circuit and measuring a voltage difference across a resistive element at an A/D converter electrically coupled to the sensor circuit. The method further includes determining an impedance of the sensor circuit based on the voltage difference.

These and other advantages of the invention will be apparent to those of ordinary skill in the art by reference to the following detailed description and the accompanying drawings.

DETAIL DESCRIPTION

A new method for determining sensor wire integrity is provided to allow the differentiation between an over/under voltage condition and a wire break event. The circuit is biased such that during a wire break event, the reading is an order of magnitude outside the normal measuring range for the sensor in order that it can be differentiated from a standard over/under voltage condition. When the sensor wiring is intact, the bias will cause a voltage reading in a region well outside the normal measurement range for the sensor. For example, the voltage output by the source may bias the sensor circuit in an amount twice the maximum value of a measurement voltage, or alternatively an amount ten times the maximum value of a measurement voltage. In this manner, the voltage reading for a non-wire break condition is not significantly influenced by the signal received by the sensor.

By sampling the wire break monitor after the sample of the sensor reading, only the current state of the wire break monitor is used to trigger a new wire break event. However, to eliminate the intermediate data results from occurring due to an asynchronous wire break event, the current state and previous state of the wire break monitor may be used to indicate that the wiring is intact before the process values of the sensor are forwarded to the central controller.

Figure 1:
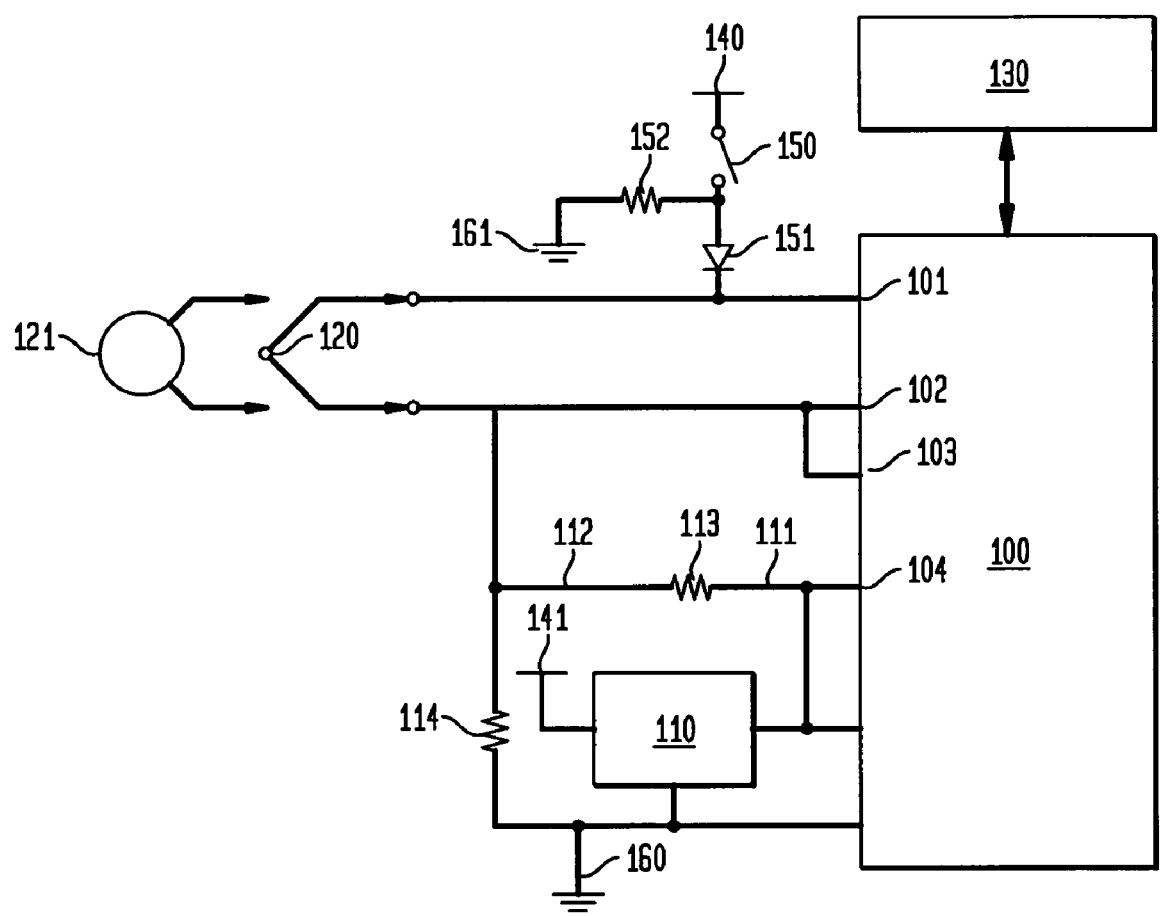
FIG. 1 is a circuit diagram illustrating an exemplary circuit for detecting wire breaks according to the present invention.

FIG. 1 illustrates a system for detecting wire breaks. Analog-to-digital converter 100 (also referred to herein as A/D converter 100) includes inputs 101, 102, 103, and 104. The inputs to A/D converter 100 may be paired to enable measurements of voltage differences. For instance, input 101 and input 102 (also referred to herein as input A or a first input set) may measure a voltage difference across sensor 120. Sensor 120 may be a thermocouple (also referred to herein as TC), or any other appropriate sensor device which generates a voltage difference based on measurement of a physical quantity. Sensor 120 measures a physical quantity which drives a voltage 121.

A/D converter 100 also includes inputs 103 and 104 (also referred to herein as input B or a second input set) which are paired to measure a voltage indicative of a wire break condition. A/D converter 100 communicates with controller 130 which operates to analyze the digitized readings of the two voltage differences input into A/D converter 100. A/D converter 100 may alternatively be two A/D converters, for instance one A/D converter for inputs 101 and 102, and another A/D converter for inputs 103 and 104.

In FIG. 1, power source 140 is used to drive the wire detection break system. Power source 140 may be a variable D/C voltage source. Alternatively, power source 140 may be a current source, which operates to drive current through the system to detect wire breaks. Switch 150 is used to apply the voltage or current output from power source 140 to the system to detect wire breaks. Diode 151 connects switch 150 to the sensor circuit, and resistor 152 connects switch 150 to ground 161. Alternative arrangements of diodes and resisters are possible for the circuit illustrated in FIG. 1, and any number of discrete linear elements (also referred to herein as resistive elements) may be used in a manner known to those with skill in the art. Reference source 110 is driven by second power source 141, which may be a variable D/C voltage source or a current source, which operates to drive current through the system to detect wire breaks which may alternatively be another output of power source 140. Reference source 110 provides a reference voltage for the system that may be input into A/D converter 100. Input 104 may read reference voltage 111 of the system. Reference voltage 111 may be set to 2.5 volts. Alternatively, reference voltage 111 may be set to any appropriate reference voltage.

Sensor output voltage 112 may be measured at inputs 101 and 102 of A/D converter 100. Sensor output voltage 112 may be 1.5 volts when switch 150 is closed allowing the wire break detection system to operate. Sensor output voltage 112 and reference voltage 111 may, for example, differ by −1 volts, representing a voltage drop across resistor 113. This wire break voltage difference is indicative of a wire break condition. The full scale voltage condition inputs 101 and 102 of A/D converter 100 may be +/−1.5 volts. Sensor output voltage 112 may be separated from ground 160 by resistor 114 in FIG. 1.

A thermocouple/voltage input is used for illustration purposes for explaining a sensor wire integrity monitor circuit in the following description of the functioning of the circuit in FIG. 1. When determining the integrity of wiring connections, switch 150 is closed. Differential input B (inputs 103 and 104) of A/D converter 100 is active, and input A (inputs 101 and 102) is inactive. Closing switch 150 connects power source 140 (also referred to herein as Vpwr, for example 5V) to the sensor wiring. This causes current to flow through the sensor wiring. A voltage drop across resistor 113 located between the B inputs is measured directly by input B of A/D converter 100. From this voltage, the impedance of the sensor wiring can be calculated by a CPU in controller 130 coupled to A/D converter 100.

When measuring voltage 121 of sensor 120 (also referred to herein as a thermocouple or TC), switch 150 is open. Differential input A of A/D converter 100 is active, and input B is inactive. The process value of voltage 121 or a TC potential is measured. A bias current through resistors 113 and 114 arranged between reference voltage 111 (also referred to herein as Vref, and for example, 2.5V) and ground 160 sets sensor output voltage 112 (also referred to herein as a common mode voltage of the input) to Voffset (for example, 1.5V). This allows a measurement of up to +/−Voffset full scale (for example, +/−1.5V). Lower voltages may be measured by setting the internal programmable gain amplifier (PGA) of A/D converter 100 for more gain. Resistor 152 may apply a negative bias to diode 151 coupling switch 150 (also referred to herein as the wire break detection switch) and power source 140 to the sensor circuit, preventing interference of the wire break circuit with the TC/Voltage measuring circuit.

Figure 2:
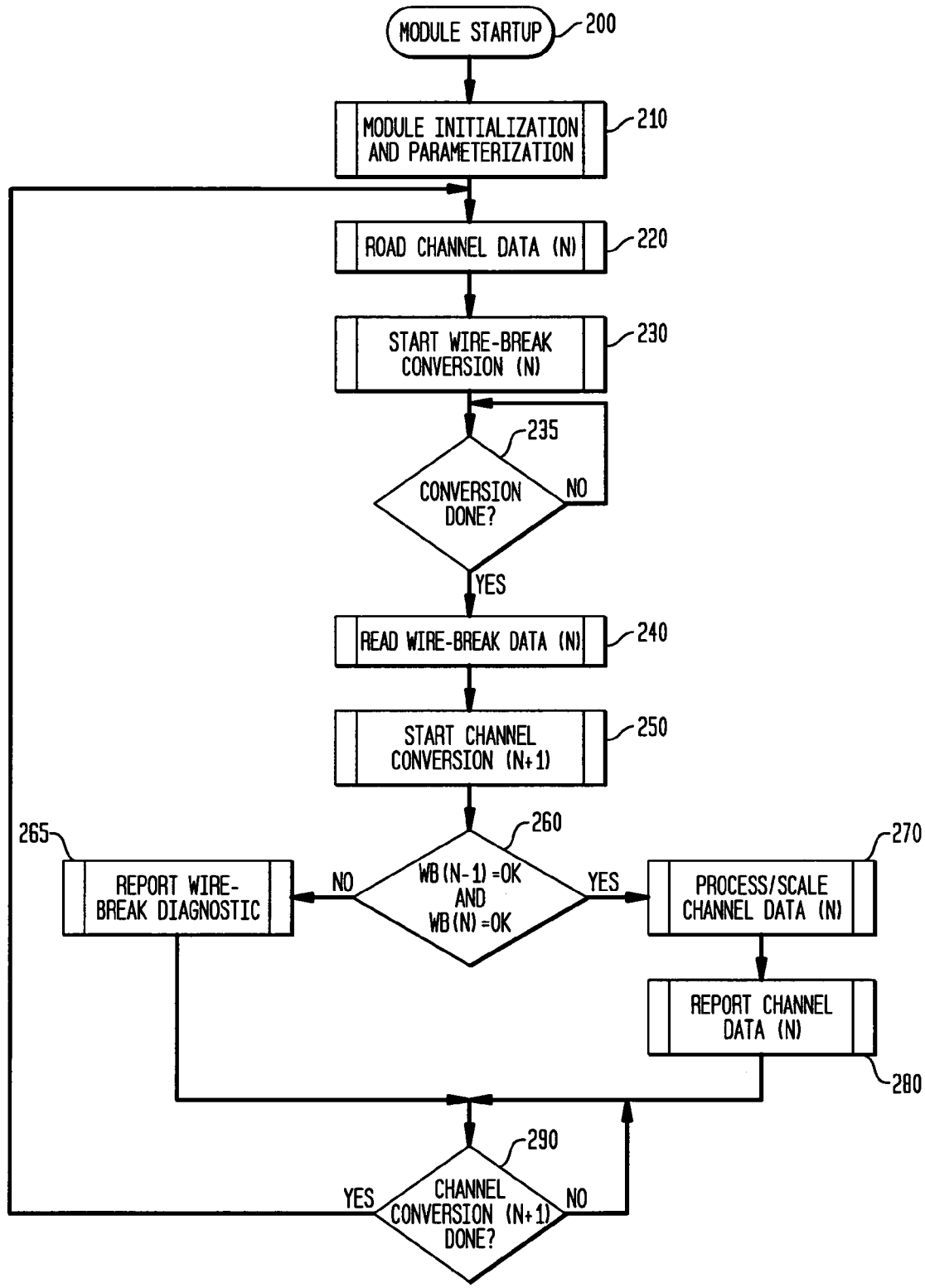
FIG. 2 is a flow diagram illustrating an exemplary method for detecting wire breaks according to the present invention.

FIG. 2 illustrates an exemplary method performed by controller 130. The method starts at operation 200, which indicates modular start-up. The method proceeds from operation 200 to operation 210, which indicates to initialize and parameterize a module. The flow then proceeds to operation 220, which indicates to read channel data (N). Channel data (N) represents sensor data, and therefore may represent the inputs to inputs 101 and 102 of A/D converter 100 in FIG. 1. The flow then proceeds to operation 230, which indicates to start wire-break conversion (N). This process represents a closing of the switch 150 and a beginning of the reading of inputs 103 and 104 of A/D converter 100 in FIG. 1. The flow proceeds from operation 230 to decision 235, which asks whether the conversion is done. If the conversion is not done, the flow reverts again to decision 235 to again ask whether the conversion is done.

When the conversion is done and the response to decision 235 is therefore affirmative, the flow proceeds to operation 240, which indicates to read wire-break data (N). This wire-break data (N) is input on inputs 103 and 104 of A/D converter 100 in FIG. 1. The flow then proceeds to operation 250 which indicates to start channel conversion (N+1). The flow proceeds from operation 250 to decision 260, which asks if both the wire break data for the N−1 reading is okay and the wire-break data for the N reading is okay. The test for the wire-break is therefore performed immediately before and after the reading of the channel data. If the answer to decision 260 is negative (i.e., if either of the readings before and after the channel indicates a wire-break), then the flow proceeds to operation 265, which indicates to report a wire-break diagnostic (also referred to herein as an error signal). Operation 265 may therefore represent an alarm, a signal, and/or a visual output to a person or other machine. If the response to decision 260 is affirmative (i.e., if there is no wire-break indication in the readings before or after the channel reading), then the flow proceeds to operation 270 which indicates to process/scale channel data (N). Operation 270 may also include logging the measurement data and outputting the data to another system for operating or monitoring a process.

After the processing of the channel data in operation 270, the flow proceeds to operation 280 which indicates to report channel data (N). The flow proceeds from operation 280 and operation 265 to decision 290, which asks whether the channel conversion (N+1) is done. If the response to decision 290 is negative, the flow reverts back again to decision 290, so that this is effectively a pause until the channel conversion is completed. When the response to the question presented in decision 290 is affirmative, the flow proceeds to operation 220.

Alternative arrangements for the flow in FIG. 2 are also possible depending on the speed of conversions possible within the system shown in FIG. 1. For instance, operation 250, which indicates to start channel conversion (N+1), may in an alternative exemplary embodiment be performed immediately prior to decision 290.

The method of guaranteeing the integrity of each process value measured shown in FIG. 2 may be summarized as follows. The switch S1 is closed and input B is measured at the A/D converter. The controlling CPU may calculate the current flow through the sensor and decide if the wiring is intact and within specified impedance, also referred to herein as an acceptance range. Next, switch S1 may be opened and the input A is measured. This value is scaled and stored by the controlling CPU. Next, switch S1 is closed again and input B is once again measured and the wiring impedance may once again be calculated. If both wiring impedance calculations result in a finding of a valid connection, in other words if both impedance readings fall within the acceptance range, then the stored process value from the sensor (Input A) is deemed valid and passed to the system. If one or both of the impedance readings falls outside of the design specification or acceptance range, then the stored process value is not passed to the system. Instead, in this case a wire fault is passed. The sequence is repeated for each measurement cycle, preventing an invalid process value (due to a wiring fault) from being passed to the central controller. The example process cycle is shown in FIG. 2 and the signal timing is shown in FIG. 3.

Figure 3:
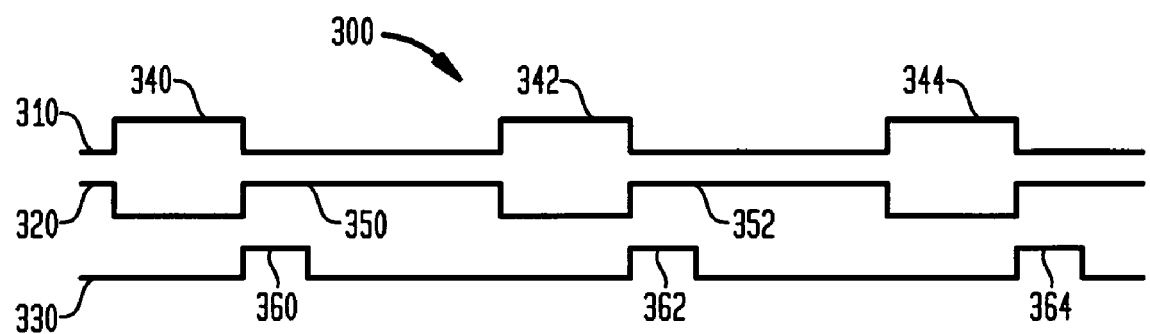
FIG. 3 is a timing waveform diagram illustrating the signals in the exemplary circuit shown in FIG. 1 and/or the used in the exemplary method shown in FIG. 2.

FIG. 3 presents timing wave form 300 representing the different signals on each of the different channels. A wire-break enable signal 310 is shown at the top of timing wave form 300. The middle wave form is channel enable 320, and the bottom wave form is process/scale enable 330. Wire-break enable 310 is "on" or positive at WB(N−1) 340, WB(N) 342, and WB(N+1) 344. When wire-break enable 310 is on, channel enable 320 is off. Channel enable 320 is "on" or positive at channel (N) 350 and channel (N+1) 352. Process/scale enable 330 is turned on at the same time channel enable 320 is turned on, however, process/scale enable 330 does not last for the entirety of the positive signal on channel enable 320. Process/scale enable 330 includes scale (N−1) 360, scale (N) 362, and scale (N+1) 364.

Figure 4:
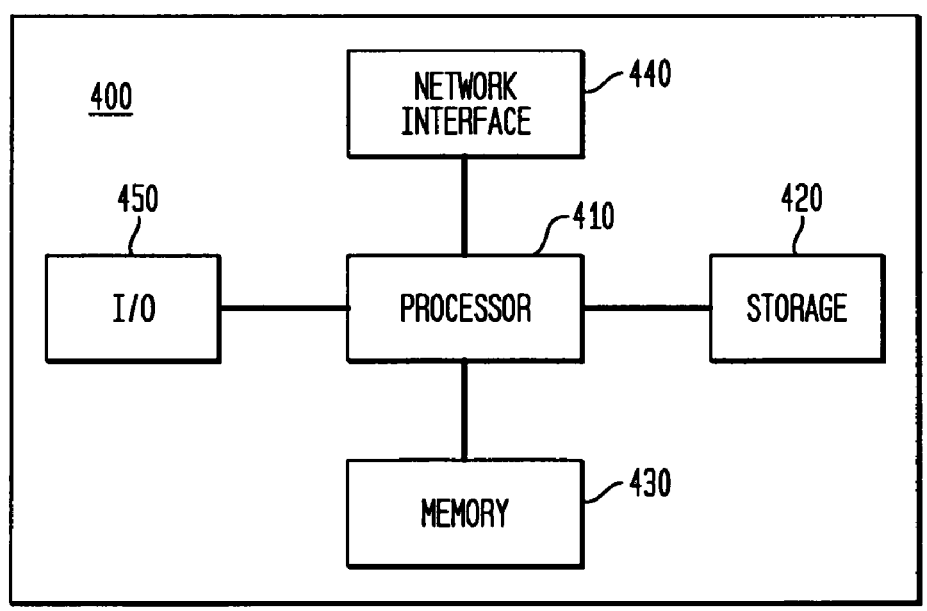
FIG. 4 is a block diagram of a computer in accordance with an embodiment of the present invention.

FIG. 4 is a high level block diagram of a computer in accordance with an embodiment of the present invention. The computer 400 can, for example, operate as controller 130 in FIG. 1. Controller 130 may also be a programmable logic controller (PLC), and the following description of computer 400 may also describe the operation of a PLC used as controller 130. Additionally, computer 400 can perform the steps described above with respect to FIG. 2. Computer 400 contains processor 410 which controls the operation of the computer by executing computer program instructions which define such operation, and which may be stored on a computer-readable recording medium. The computer program instructions may be stored in storage 420 (e.g., a magnetic disk, a database) and loaded into memory 430 when execution of the computer program instructions is desired. Thus, the computer operation will be defined by computer program instructions stored in memory 430 and/or storage 420 and computer 400 will be controlled by processor 410 executing the computer program instructions. Computer 400 also includes one or more network interfaces 440 for communicating with other devices, for example other computers, servers, or websites. Network interface 440 may, for example, be a local network, a wireless network, an intranet, or the Internet. In the case of computer 400 being a PLC, network interface 440 may be a profinet or profibus. Computer 400 also includes input/output 450, which represents devices which allow for user interaction with the computer 400 (e.g., display, keyboard, mouse, speakers, buttons, webcams, etc.). One skilled in the art will recognize that an implementation of an actual computer will contain other components as well, and that FIG. 4 is a high level representation of some of the components of such a computer for illustrative purposes.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention.

We claim:

1. A circuit, comprising:
   a power source;
   a sensor circuit electrically coupled by a switch to the power source;
   an A/D converter electrically coupled to the sensor circuit and configured to read a voltage difference across a resistive element to determine an impedance of the sensor circuit, and
   a controller configured to compare the impedance of the sensor circuit to an acceptance range, the acceptance range indicating that a wire break condition does not exist,
   wherein the sensor circuit is configured to output a measurement voltage when the switch is open; the A/D converter is configured to read the measurement voltage; and the controller is further configured to log the measurement voltage if the impedance falls within the acceptance range.

2. The circuit of claim 1, wherein the measurement voltage is proportional to a physical quantity.

3. The circuit of claim 1, wherein the power source is a voltage source, and a voltage output by the voltage source is at least two times a maximum value of the measurement voltage.

4. The circuit of claim 3, wherein the voltage is at least ten times the maximum value of the measurement voltage.

5. The circuit of claim 1, wherein the controller is further adapted to output an error signal if the impedance falls outside the acceptance range.

6. The circuit of claim 1, wherein the controller is further adapted to compare a second impedance of the sensor circuit determined by the A/D converter by reading a second voltage difference across the resistive element, and adapted to log the measurement voltage if the impedance and the second impedance both fall within the acceptance range.

7. The circuit of claim 6, wherein the controller is further adapted to output an error signal if at least one of the impedance and the second impedance falls outside the acceptance range.

8. The circuit of claim 6, wherein:
   the power source causes the voltage difference across the resistive element before the switch is opened;
   the switch is opened to enable the sensor circuit to output the measurement; and
   the power source causes the second voltage difference across the resistive element after the switch is closed again after being opened.

9. The circuit of claim 1, wherein the A/D converter includes two sets of inputs, a first input set being adapted to read the measurement voltage, and a second input set being adapted to read the voltage difference.

10. The circuit of claim 1, wherein:
    a further A/D converter is adapted to read the measurement voltage, the A/D converter and the further A/D converter each using a single input channel.

11. The circuit of claim 1, wherein the power source is a current source.

12. A method, comprising:
    closing a switch electrically coupling a power source to a sensor circuit;
    measuring a voltage difference across a resistive element at an A/D converter electrically coupled to the sensor circuit;
    determining an impedance of the sensor circuit based on the voltage difference;
    outputting a measurement voltage by the sensor circuit when the switch is open; and
    reading the measurement voltage at the A/D converter
    comparing, by a controller, the impedance of the sensor circuit to an acceptance range, the acceptance range indicating that a wire break condition does not exist; and logging the measurement voltage if the impedance falls within the acceptance range.

13. The method of claim 12, wherein the measurement voltage is proportional to a physical quantity.

14. The method of claim 12, wherein:
the power source is a voltage source;
the voltage is applied to the sensor circuit; and
the voltage is at least two times a maximum value of the measurement voltage.

15. The method of claim 14, wherein the voltage is at least ten times the maximum value of the measurement voltage.

16. The method of claim 15, further comprising outputting an error signal by the controller if the impedance falls outside the acceptance range.

17. The method of claim 12, further comprising:
comparing by the controller a second impedance of the sensor circuit determined by the A/D converter by reading a second voltage difference across the resistive element; and
logging the measurement voltage if the impedance and the second impedance both fall within the acceptance range.

18. The method of claim 17, further comprising outputting an error signal by the controller if at least one of the impedance and the second impedance falls outside the acceptance range.

19. The method of claim 17, further comprising:
opening the switch to enable the sensor circuit to output the measurement; wherein:
the voltage difference is caused by the power source before the switch is opened; and
the second voltage difference is caused by the power source after the switch is opened.

20. The method of claim 12, wherein:
the measurement voltage is read at a first input set of the A/D converter; and
the voltage difference is read at a second input set of the A/D converter.

21. The method of claim 12, further comprising:
reading the measurement voltage at a further A/D converter, the A/D converter and the further A/D converter each using a single input channel.

22. The method of claim 12, wherein the power source is a current source.

* * * * *